(12) United States Patent
Hashiba

(10) Patent No.: US 7,733,730 B2
(45) Date of Patent: Jun. 8, 2010

(54) NEGATIVE VOLTAGE DETECTION CIRCUIT AND SEMICONDUCTOR INTEGRATED CIRCUIT

(75) Inventor: Yoshiaki Hashiba, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 12/235,175

(22) Filed: Sep. 22, 2008

(65) Prior Publication Data

US 2009/0080281 A1 Mar. 26, 2009

(30) Foreign Application Priority Data

Sep. 21, 2007 (JP) .............................. 2007-245063

(51) Int. Cl.
G11C 7/04 (2006.01)
(52) U.S. Cl. .................. 365/211; 365/230.06; 327/534; 327/538
(58) Field of Classification Search ............ 365/230.06, 365/189.09, 210.1, 211; 327/142, 161, 162, 327/530, 534–541, 512, 513; 326/32–34
See application file for complete search history.

(56) References Cited

U.S. PATENT DOCUMENTS 6,084,387 A * 7/2000 Kaneko et al. .............. 323/281
6,566,931 B2 * 5/2003 Higuchi ...................... 327/333
7,524,108 B2 * 4/2009 Yoshida et al. .............. 374/178
2009/0174468 A1 * 7/2009 Yoshida et al. .............. 327/539

FOREIGN PATENT DOCUMENTS

| JP | 11-219596 | 8/1999 |
| JP | 2000-19200 | 1/2000 |
| JP | 2001-325033 | 11/2001 |
| JP | 2004-350290 | 12/2004 |

* cited by examiner

*Primary Examiner*—Richard Elms
*Assistant Examiner*—Hien N Nguyen
(74) *Attorney, Agent, or Firm*—Oblon, Spivak, McClelland, Maier & Neustadt, L.L.P.

(57) ABSTRACT

A negative voltage detection circuit including first and second MOS transistor circuits configured to change a dimension size of a transistor based on a control signal, a first comparator circuit, a gate electrode of the second MOS transistor circuit commonly coupled to the gate electrode of the first MOS transistor circuit forming a current mirror circuit, a resistive divider supplied with a negative voltage to be detected, and coupled to the end of the current path of the second MOS transistor circuit to generate a second voltage, a second voltage comparator circuit to compare the second voltage with a reference voltage and to generate a detection signal corresponding to the value of the negative voltage, and a detection circuit for detecting a temperature or power supply voltage, generate the control signal corresponding to the detection result, and supply the control signal to the first and second MOS transistor circuits.

10 Claims, 8 Drawing Sheets

| Temperature | Low | Normal | High |
|---|---|---|---|
| Selected Transistor | 1 | 1+2 | 1+2+3 |

Fig. 5

| Voltage | Low | Normal | High |
|---|---|---|---|
| Selected Transistor | 1 | 1+2 | 1+2+3 |

Fig. 6

| V \ T | Low | Normal | High |
|---|---|---|---|
| High | 1 | 1+2 | 1+2+3 |
| Normal | 1+2 | 1+2+3 | 1+2+3+4 |
| Low | 1+2+3 | 1+2+3+4 | 1+2+3+4+5 |

Fig. 7

NEGATIVE VOLTAGE DETECTION CIRCUIT AND SEMICONDUCTOR INTEGRATED CIRCUIT

CROSS-REFERENCE TO RELATED APPLICATIONS

This application is based upon and claims the benefit of priority from the prior Japanese Patent Application No. 2007-245063, filed Sep. 21, 2007, the entire contents of which are incorporated herein by reference.

BACKGROUND OF THE INVENTION

1. Field of the Invention

The present invention relates to a negative voltage detection circuit provided with a negative voltage boost circuit, and also relates to a semiconductor integrated circuit provided with the negative voltage detection circuit.

2. Description of the Related Art

In conventional types of negative voltage detection circuits, a negative voltage to be detected is applied to one end of a resistive divider, and a constant current is fed to the other end of the resistive divider to generate a detected voltage with a positive polarity. Then, the negative voltage is detected by comparing the detected voltage thus generated, with a reference voltage using a comparator. A mirror current may also be used as the constant current to be fed to the other end of the resistive divider. This mirror current is generated such that a current from a constant current source passes through a current mirror circuit. In addition, the reference voltage compared in the comparator is generated by a reference voltage generation circuit, such as a band gap reference (BGR) circuit which generates a reference voltage of approximately 1.25 V and depends on a temperature and power supply voltage only to a small extent. The reference voltage is then applied to an inverting input terminal of a comparator, and the output of the comparator is connected to the gate electrode of a MOS transistor. In the MOS transistor, one end of a current path is coupled to a power supply node, and a current is fed from the other end of the current path to a resistance, thereby generating a voltage. This voltage is then fed back to the non-inverting input terminal of the comparator, and a reference current is thereby generated by controlling the gate electrode of the MOS transistor. This reference current then passes through the current mirror circuit to generate a mirror current, which is then applied to the other end of the resistive divider.

A current mirror circuit consists of a pair of P channel MOS transistors whose gate electrodes are commonly coupled to each other. In general, the drain current Ids of a MOS transistor decreases when the power supply voltage decreases. Additionally, the threshold value Vth and the drain current Ids also decrease when the temperature rises. Considering the possible variation between a pair of MOS transistors due to the manufacturing process, it is preferable to increase a voltage Vgs between the gate and the source of the P channel MOS transistor constituting the current mirror circuit.

However, in the conventional negative voltage detection circuit, the operating point of the P channel MOS transistor is fixed. Therefore, in the case where a variation exists between a pair of transistors, a change in temperature or power supply voltage can cause the mirror current to deviate, thereby causing a fluctuation in the detection level of a negative voltage. As such, the precision of conventional negative voltage detection circuits is influenced by either a fluctuation in power supply voltage or temperature.

BRIEF SUMMARY OF THE INVENTION

According to one aspect of the present invention, a negative voltage detection circuit is configured to change a dimension size of a transistor on the basis of a control signal. The negative voltage detection circuit including a resistance with a first end coupled to the current path of a first MOS transistor circuit and a second resistive end coupled to a supply node of a ground potential, a first comparator circuit configured to compare a first voltage generated at the first end of the resistance, with a reference voltage, configured to control a gate electrode of the first MOS transistor circuit, a second MOS transistor circuit in which one end of a current path is coupled to a supply node of a power supply voltage and is configured to change a dimension size of a transistor on the basis of the control signal, and whose gate electrode is commonly coupled to the gate electrode of the first MOS transistor circuit so as to form a current mirror circuit together with the first MOS transistor circuit, a resistive divider including a first one supplied with a negative voltage to be detected, and a second end coupled to the second end of the current path of the second MOS transistor circuit to generate a second voltage, a second voltage comparator circuit configured to compare the second voltage with a reference voltage and to generate a detection signal corresponding to the value of the negative voltage, and a detection circuit configured to detect at least one of a temperature or a power supply voltage, generate the control signal corresponding to the detection result, and supply the control signal to the first and second MOS transistor circuits.

According to another aspect of the present invention, a semiconductor integrated circuit has a reference voltage generating circuit generating a reference voltage, a positive voltage generating circuit generating a positive polarity voltage on the basis of the reference voltage generated in the reference voltage generating circuit, a negative voltage generation circuit generating a negative polarity voltage on the basis of the reference voltage generated in the reference voltage generating circuit, a voltage switching circuit supplied with the positive polarity voltage generated in the positive voltage generating circuit and the negative polarity voltage generated in the negative voltage generating circuit, and configured to select and output either one of the voltages, and a memory cell array, a row decoder, a column decoder and sense amplifier, each of which has a power supply terminal to be supplied with the either one of the positive polarity voltage and the negative polarity voltage selected by the voltage switching circuit, wherein the negative voltage generating circuit includes an oscillation circuit, a negative voltage boost circuit supplied with an oscillation output of the oscillation circuit and generating the negative polarity voltage, and a negative voltage detection circuit configured to detect the negative polarity voltage generated in the negative voltage boost circuit to control the oscillation operation of the oscillation circuit, and wherein the negative voltage detection circuit includes a first MOS transistor circuit in which one end of a current path is coupled to a supply node of a power supply voltage and configured to change the dimension size of a transistor on the basis of a control signal, a resistance whose one end is coupled to the other end of the current path of the first MOS transistor circuit and whose other end is coupled to a supply node of a ground potential, a first comparator circuit configured to compare a first voltage generated at the one end of the resistance, with a reference voltage, and configured to control a gate electrode of the first MOS transistor circuit, a second MOS transistor circuit in which one end of a current path is coupled to a supply node of a power supply voltage, configured to change the dimension size of a transistor on the basis of the control signal and whose gate electrode is commonly coupled to a gate electrode of the first MOS transistor circuit so as to form a current mirror circuit together with the first MOS transistor circuit, a resistive divider whose one end is supplied with a negative polarity voltage to be detected, whose other end is coupled to the other end of the current path of the second MOS transistor circuit, and generating a second voltage at the other end thereof, a second voltage comparator circuit configured to compare the second voltage with a reference voltage and generate a detection signal corresponding to the value of the negative polarity voltage, and a detection circuit configured to detect at least one of a temperature and a power supply voltage, generate the control signal corresponding to the detection result, and supply the control signal to the first and second MOS transistor circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is a diagram indicating the relation between the detected temperature in the temperature detection circuit of FIG. 2 and a MOS transistor in first and second MOS transistor circuits;

FIG. 6 is a diagram indicating the relation between the detected voltage in the voltage detection circuit of FIG. 3 and a MOS transistor in the first and the second MOS transistor circuits;

FIG. 7 is a diagram indicating the relation among the detected temperature in the temperature detection circuit of FIG. 4, the detected voltage in the voltage detection circuit of FIG. 4, and a MOS transistor in the first and the second MOS transistor circuits.

DETAILED DESCRIPTION OF THE PREFERRED EMBODIMENTS

Figure 1:
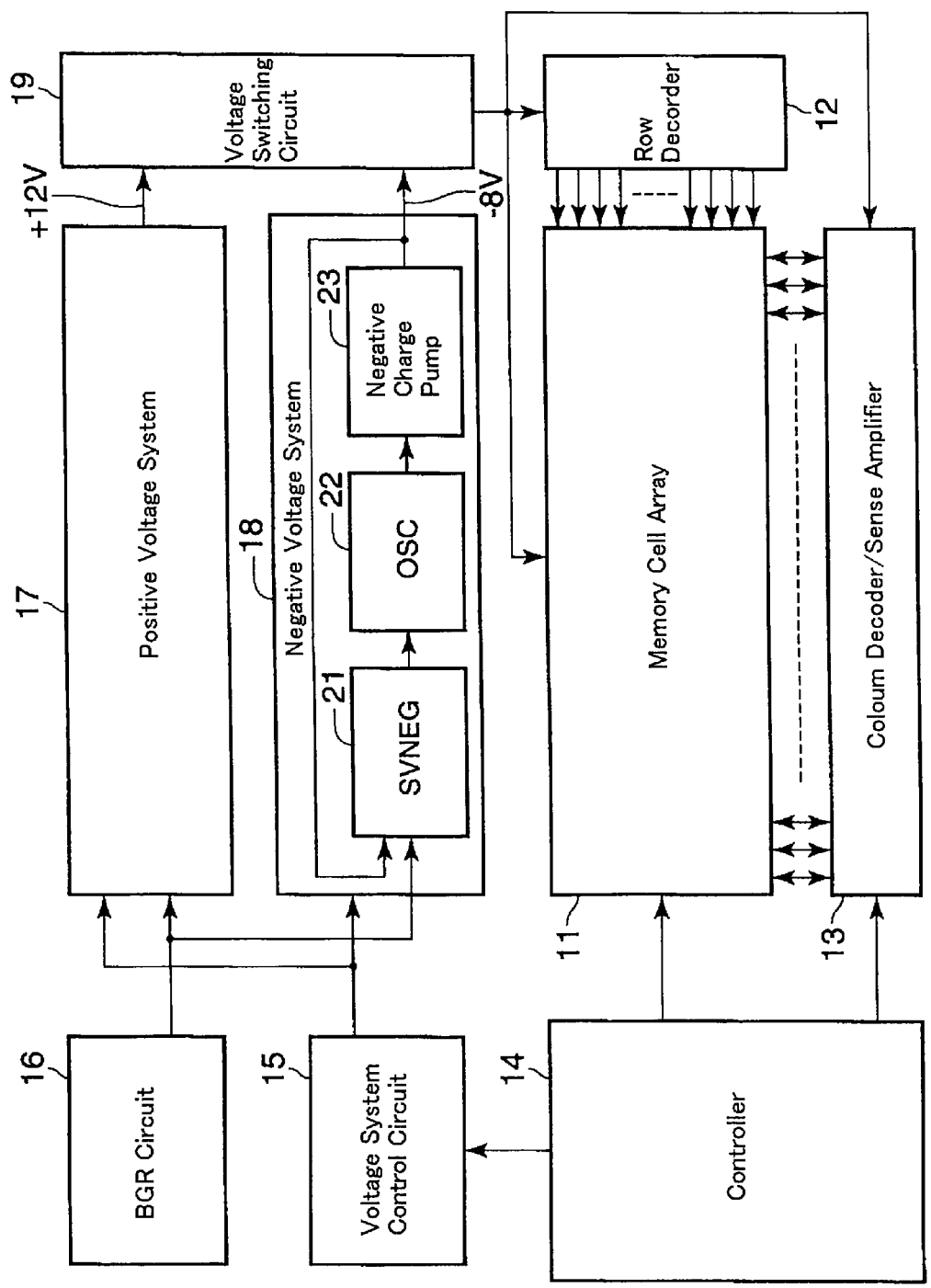
FIG. 1 is a block diagram of a nonvolatile semiconductor integrated circuit provided with a negative voltage detection circuit according to the present invention.

Various other objects, features and attendant advantages of the present invention will be more fully appreciated from the following detailed description when considered in connection with the accompanying drawings in which like reference characters designate like or corresponding parts throughout the several views.

FIG. 1 is a block diagram indicating a configuration of a main body of a nonvolatile semiconductor integrated circuit, such as a flash memory circuit, that includes a negative voltage detection circuit according to the present invention. The nonvolatile semiconductor integrated circuit includes a memory cell array 11, a row decoder 12 (address decoder circuit), a column decoder/sense amplifier 13 (selector/data readout circuit), a controller 14, a voltage system control circuit 15 (voltage generation control circuit), a band gap reference (BGR) circuit 16 (reference voltage generation circuit), a positive voltage system 17 (positive voltage generation circuit), a negative voltage system 18 (negative voltage generation circuit), and a voltage switching circuit 19 (switching circuit for switching power supply output).

The memory cell array 11, includes a plurality of nonvolatile memory cells that are arranged into rows and columns. A row of memory cells are selected by the row decoder 12, and a column of memory cells are selected by the column decoder/sense amplifier 13. The data read out from the selected memory cell to a bit line is amplified by a sense amplifier. Alternatively, written data input from the outside is amplified by a sense amplifier, applied to a bit line and then written in the selected memory cell.

The controller 14 controls the operation of the entire nonvolatile semiconductor integrated circuit, including the memory cell array 11, the column decoder/sense amplifier 13, the voltage system control circuit 15 and the like.

The BGR circuit 16 generates a reference voltage of, for example, 1.25 V that has no temperature dependence. This reference voltage is applied to the positive voltage system 17 and the negative voltage system 18. The operations of the positive voltage system 17 and the negative voltage system 18 are controlled by the voltage system control circuit 15; the positive voltage system 17 generates a voltage of, for example, +12 V and the negative voltage system 18 generates a voltage of, for example, −8 V.

The negative voltage system 18 includes a negative voltage detection circuit 21 (SVNEG), an oscillator 22 (OSC: oscillation circuit), and a negative charge pump circuit 23 (negative voltage boost circuit). In the negative voltage system 18, the boost operation of the negative charge pump circuit 23 is controlled by the oscillation output of the oscillator 22, thus generating a negative voltage. This negative voltage is then applied to the negative voltage detection circuit 21. In the negative voltage detection circuit 21, the negative voltage is applied to one end of a resistive divider, and a constant current is applied to the other end to generate a voltage with a positive polarity. This positive polarity voltage is compared with the reference voltage generated by the BGR circuit 16 via a comparator circuit, to detect a negative voltage. Then, the oscillation operation of the oscillator 22 is controlled according to this detection result.

Next, the positive voltage output (+12V) of the positive voltage system 17, and the negative voltage output (−8V) of the negative voltage system 18 are applied to the voltage switching circuit 19. The voltage switching circuit 19 supplies a positive voltage output and a negative voltage output to the power supply terminals of the memory cell array 11, the row decoder 12 and the column decoder/sense amplifier 13. The operations of the memory cell array 11, the row decoder 12 and the column decoder/sense amplifier 13 are controlled by the controller 14, and the power supply voltage is selectively switched according to at least one of the reading operation of the data, the writing operation of the data, the deleting operation of data, or other operations.

First Embodiment

Figure 2:
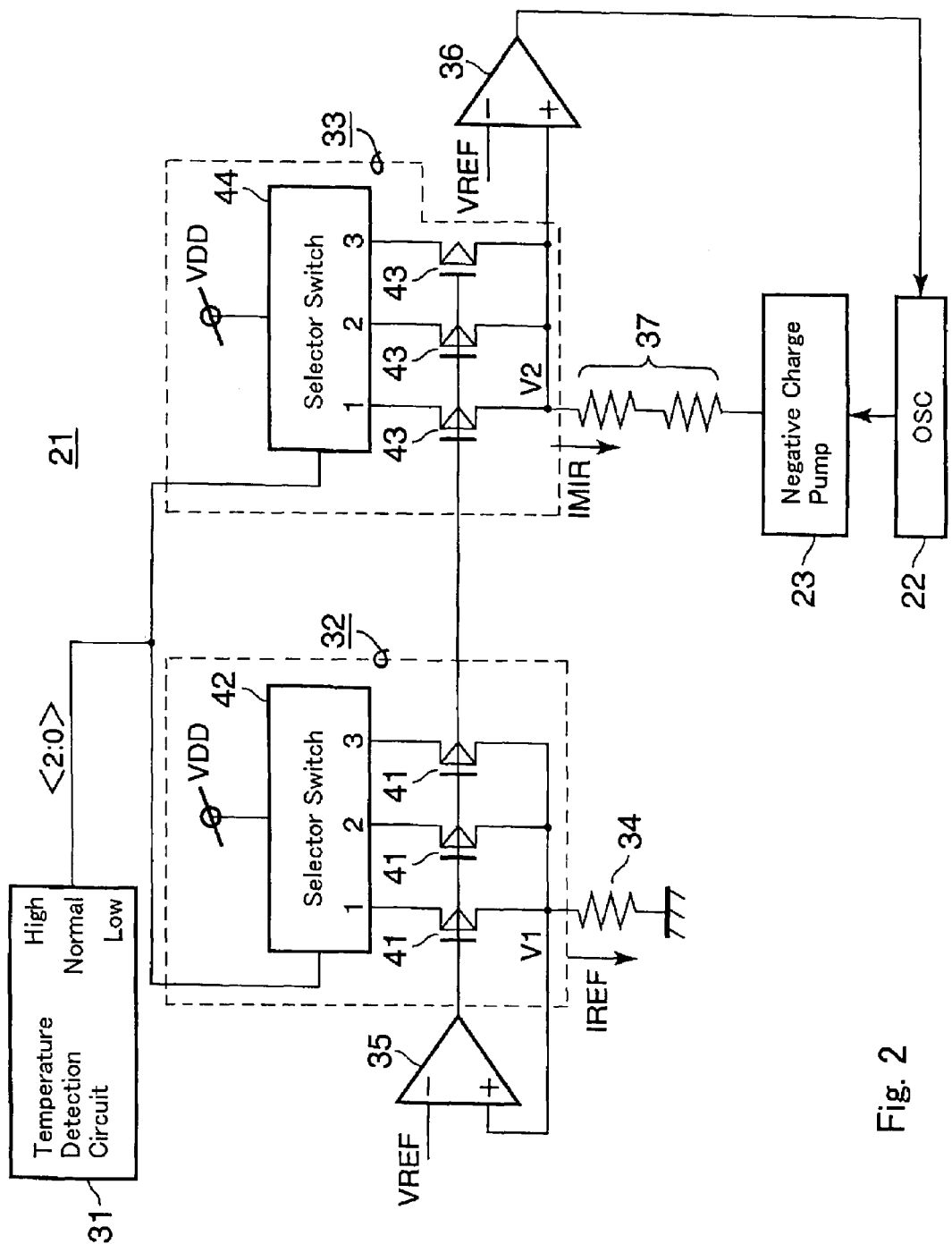
FIG. 2 is a circuit diagram of a negative voltage detection circuit according to a first embodiment.

FIG. 2 is a circuit diagram that shows a negative voltage detection circuit 21, according to a first embodiment, as well as an oscillator 22 and a negative charge pump circuit 23. The negative voltage detection circuit 21 includes a temperature detection circuit 31, a first MOS transistor circuit 32, a second MOS transistor circuit 33, a resistance 34, a first comparator circuit 35, a second comparator circuit 36 and a resistive divider 37.

The temperature detection circuit 31 detects a current temperature, (i.e., high, normal or low) generates a control signal, and transmits the control signal to the first MOS transistor circuit 32 and the second MOS transistor circuit 33.

The first MOS transistor circuit 32 includes a plurality of P channel MOS transistors 41 whose gate electrodes are commonly coupled to each other, a selector switch circuit 42 coupled between one end of the current path from a source to a drain (hereinafter, called a source-drain current path) of each of the MOS transistors 41, and a supply node power supply voltage VDD. The selector switch circuit 42 selects one end of the source-drain current path of at least one of the MOS transistors 41 on the basis of a control signal received from the temperature detection circuit 31, and then couples the at least one end to the supply node of the power supply voltage. In this example, each of the plurality of MOS transistors have the same size (channel width and channel length), however, transistors of different sizes may also be used.

Based on the control signals received from the temperature detection circuit 31, the selector switch circuit 42 controls the connection of the MOS transistors 41 to the power supply node in the following way. When the temperature detection circuit 31 detects that the temperature is in a low temperature range, the selector switch circuit 42 selects one end of the source-drain current path of one of the MOS transistors 41, and couples this end to the supply node of the power supply voltage. When the temperature is detected to be in the normal temperature range, the selector switch circuit 42 selects one end of the source-drain current path of two of the MOS transistors 41, and couples each of the two selected transistors to the supply node of the power supply voltage. Finally, when the temperature is detected to be the high temperature range, the selector switch circuit 42 selects one end of the source-drain current path of three MOS transistors 41, and couples each of the three selected transistors to the supply node of the power supply voltage. Accordingly, in the first MOS transistor circuit 32, the dimension size of the transistor is configured to change on the basis of the control signal received from the temperature detection circuit 31. More specifically, the dimension size is minimized for a low temperature and is maximized for a high temperature. In the case of the normal temperature, the dimension size of the transistor is changed to a medium size between the minimum and maximum sizes.

One end of the above-mentioned resistance 34 is coupled to the other end of the current path of the first MOS transistor circuit 31, and the other end of the resistance 34 is coupled to the supply node of the ground potential. Next, a first voltage V1 located at one end of the resistance 34 is applied to a non-inverting input terminal of the first comparator circuit 35, and a reference voltage VREF generated by a BGR circuit 16 (not shown) is applied to the inverting input terminal of the first comparator circuit 35. The first comparator circuit 35 then compares the first voltage V1 with the reference voltage VREF, and controls the gate electrode of the MOS transistor 41 in the first MOS transistor circuit 31 on the basis of this comparison result.

A circuit that includes the above-mentioned first MOS transistor circuit 32, resistance 34 and the first comparator circuit 35 thus generates a reference current IREF corresponding to the reference voltage VREF.

The second MOS transistor circuit 33 includes a plurality of P channel MOS transistors 43 in which gate electrodes are commonly coupled to each other and to the gate electrodes of the P channel MOS transistors 41 in the first MOS transistor circuit 32. The second MOS transistor circuit further includes a selector switch circuit 44 that is coupled between one end of each of the source-drain current paths of the MOS transistors 43 and a power supply voltage VDD. The selector switch selects one end of the source-drain current path on the basis of a control signal received from the temperature detection circuit 31 and then couples that end to the supply node of the power supply voltage. In this example, each of the plurality of MOS transistors have the same size (channel width and channel length), however, transistors of different sizes may also be used.

Based on the control signals received from the temperature detection circuit 31, the selector switch circuit 44 controls the connection of the MOS transistors 43 to the power supply node in the following way. When the temperature detection circuit 31 detects that the temperature is in a low temperature range, the selector switch circuit 44 selects one end of the source-drain current path of one of the MOS transistors 43, and couples that end to the supply node of the power supply voltage. When the temperature is detected to be in a normal temperature range, the selector switch circuit 44 selects one end of the source-drain current path of two of the MOS transistors 43, and couples each of the two selected transistors to the supply node of the power supply voltage. Finally, when the temperature is detected to be at a high temperature range, the selector switch circuit 44 selects one end of the source-drain current path of three MOS transistors 43, and couples each of the three selected transistors to the supply node of the power supply voltage. Accordingly, in the second MOS transistor circuit 33, the dimension size of the transistor is changed on the basis of the control signal outputted from the temperature detection circuit 31, as is the case with the first MOS transistor circuit 32. More specifically, the dimension size is minimized for a low temperature and is maximized for a high temperature.

FIG. 5 shows the relationship between the detected temperature in the temperature detection circuit 31 and the MOS transistors 41 of the first MOS transistor circuit 32, and transistors 43 of the second MOS transistor circuit 33. The MOS transistors are selected based on the control signal output by the temperature detection circuit 31. As such, numerals "1" to "3" denote which of the transistors connected to the selector switch circuits 42 and 44 will be selected.

In addition, the second MOS transistor circuit 33 constitutes a current mirror circuit together with the first MOS transistor circuit 32. As such, the mirror current IMIR of the second MOS transistor circuit 33 corresponds to the reference current IREF of the first MOS transistor circuit 32 and flows from the other end of transistors 43 (i.e., the end not connected to the Selector Switch 44).

A negative voltage generated in the negative charge pump circuit 23, that is a negative voltage to be detected, is applied to a first end of the resistive divider 37, and the other end of the current path of the second MOS transistor circuit 33 is coupled to a second end of the resistive divider 37. Then, the mirror current IMIR of the second MOS transistor circuit 33 flows from the second end of the resistive divider 37, thus generating a second voltage V2 with positive polarity on the second end of the resistive divider 37. This second voltage V2 is then applied to a non-inverting input terminal of the second comparator circuit 36, and a reference voltage VREF generated by a BGR circuit 16 (not shown) is applied to the inverting input terminal of the second comparator circuit 36. The second comparator circuit 36 then compares the second voltage V2 with the reference voltage VREF and generates a detection signal corresponding to the negative voltage value on the basis of this comparison result.

The basic operation of the negative voltage detection circuit 21 that has the above-mentioned configuration is summarized as follows. The reference voltage VREF generated in the BGR circuit is applied to the inverting input terminal of the first comparator circuit 35, and the output of the first comparator circuit 35 is applied to the gate electrode of the MOS transistor 41 in the first MOS transistor circuit 32. Since the one end of the source-drain current path of at least one of the three MOS transistors 41 in the first MOS transistor circuit 32 is coupled to the supply node of the power supply voltage, the current flows from the other end of the first MOS transistor circuit 32 to the resistance 34, and thereby the first voltage V1 is generated. The first voltage V1 generated in the resistance 34 is fed back to the non-inverting input terminal of the first comparator circuit 35 and the reference current IREF is generated by controlling the gate electrode of the MOS transistor 41. The generated reference current IREF then generates the mirror current IMIR by passing through a current mirror circuit consisting of the first MOS transistor circuit 32 and the second MOS transistor circuit 33, and the mirror current is applied to the second end of the resistive divider 37.

A negative voltage to be detected is next applied to a first end of the resistive divider 37. The mirror current IMIR (constant current) flows to the second end of the resistive divider 37, and thereby the detected voltage with a positive polarity (the second voltage V2) is generated. Therefore, a negative voltage is detected by comparing the voltage generated with the reference voltage VREF by means of the second comparator circuit 36.

As described above, the drain current Ids of a MOS transistor decreases when the temperature rises, and the drain current Ids increases when the temperature decreases. As such, in the negative voltage detection circuit of the first embodiment, when the temperature is higher than normal, three of the plurality of MOS transistors 41 in the first MOS transistor circuit 32 and three of the plurality of MOS transistors 43, in the second MOS transistor circuit 33 are selected and a current flows therein. As such, the negative voltage detection circuit can compensate for high temperatures and the current Ids can be maintained. Likewise, when a normal temperature is detected, two of the plurality of MOS transistors 41 in the first MOS transistor circuit 32 and two of the plurality of MOS transistors 43, in the second MOS transistor circuit 33 are selected and a current flows therein. Finally, when the temperature is lower than normal, one of the plurality of MOS transistors 41 in the first MOS transistor circuit 32 and one of the plurality of MOS transistors 43, in the second MOS transistor circuit 33 is selected and a current flows therein. As such, the negative voltage detection circuit can compensate for low temperatures and the current Ids can be secured (maintained).

As described above, in the negative voltage detection circuit of the first embodiment, even if the temperature changes, the operating points of the transistors 41 and 43 constituting the minor current circuit can always be optimally maintained. Therefore, even in the case where variation between a pair of MOS transistors is generated, a gap of a current between a reference current and a mirror current can be reduced, and thereby the fluctuation of the detection level of a negative voltage can be avoided.

Second Embodiment

Figure 3:
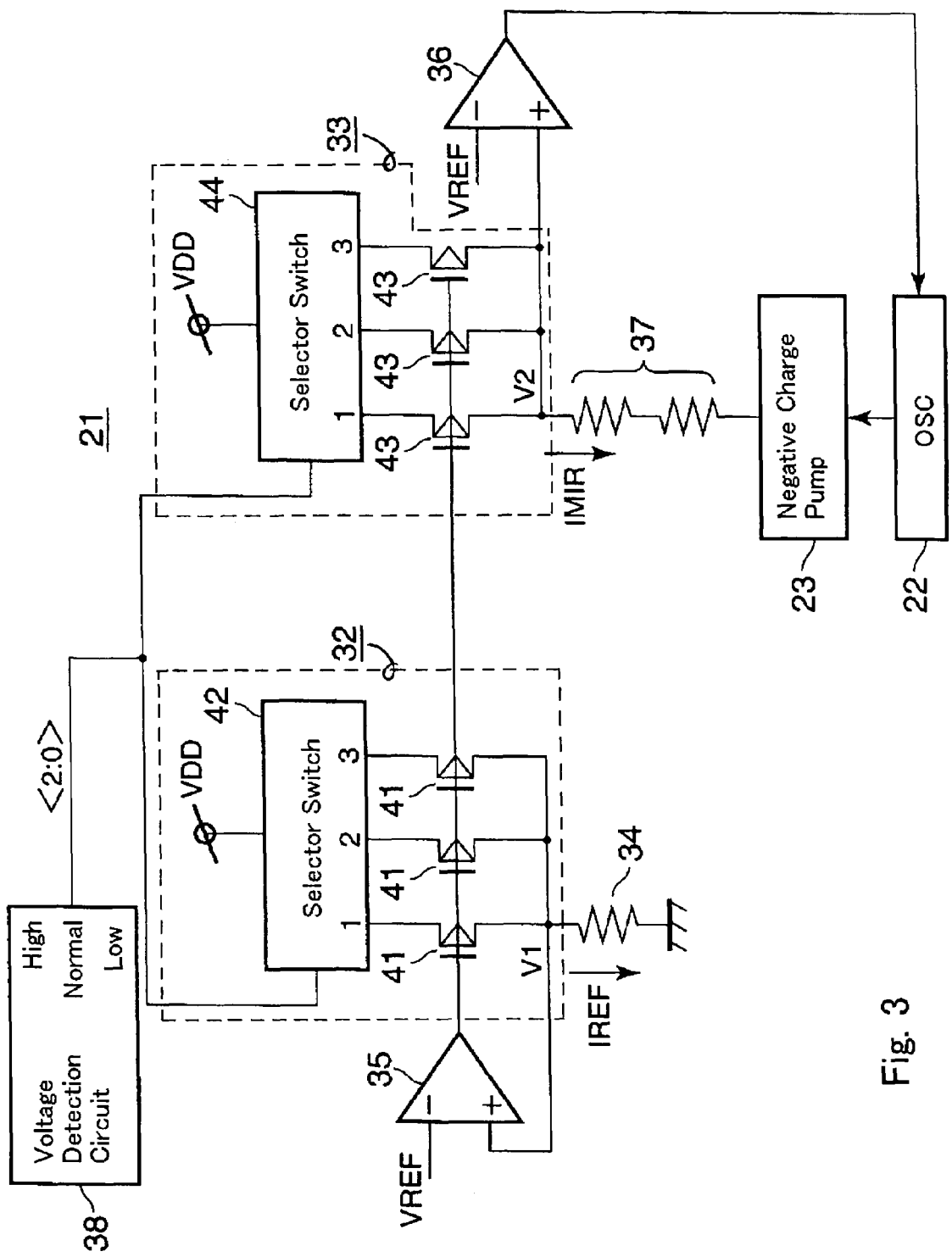
FIG. 3 is a circuit diagram of a negative voltage detection circuit according to a second embodiment.

FIG. 3 is a circuit diagram that shows the negative voltage detection circuit 21 according to a second embodiment.

The difference between the negative voltage detection circuit 21 of the second embodiment and that of the first embodiment shown in FIG. 2 is that the temperature detection circuit 31 is replaced with the voltage detection circuit 38. The voltage detection circuit 38 detects that a value of the electric supply voltage VDD is in the range of, for example, a high voltage, a medium voltage (specified value) or a low voltage, and then generates and transmits a control signal to the first MOS transistor circuit 32 and the second MOS transistor circuit 33. The other configurations are the same as those indicated in FIG. 2, and thus the same reference numerals are denoted to the parts corresponding to those in FIG. 2 and their descriptions will be omitted.

FIG. 6 shows the relationship between the detected voltage in the voltage detection circuit 38 and the MOS transistors 41 of the first MOS transistor circuit 32 and the MOS transistors 43 of the second MOS transistor circuit 33. The MOS transistors are selected based on the control signal output by the voltage detection circuit 38. As such, numerals "1" to "3" denote which of the transistors connected to the selector switch circuits 42 and 44 will be selected.

As described above, the drain current Ids of a MOS transistor decreases when the power supply voltage decreases, and the drain current Ids increases when the voltage rises.

As such, in the negative voltage detection circuit of the second embodiment, when the power supply voltage is lower than a medium voltage (i.e., below a specified value), three of the plurality of MOS transistors 41 in the first MOS transistor circuit 32 and three of the plurality of MOS transistors 43, in the second MOS transistor circuit 33 are selected and a current flows therein. Therefore, the negative voltage detection circuit can compensate for low voltage and the current Ids can be maintained. Alternatively, when the power supply voltage is higher than a medium voltage (i.e., above a specified value), one of the plurality of MOS transistors 41 in the first MOS transistor circuit 32 and one of the plurality of MOS transistors 43, in the second MOS transistor circuit 33 is selected and a current flows therein. As such, the negative voltage detection circuit can compensate for high voltage and the current Ids can be maintained.

As described above, in the negative voltage detection circuit of the second embodiment, even if the power supply voltage changes, the operating points of the transistors 41 and 43 constituting the mirror current circuit can always be optimally maintained. Hence, even in the case where variation between a pair of MOS transistors is generated, a gap of a current between a reference current and a mirror current can be reduced. Thereby the fluctuation of the detection level of a negative voltage can be avoided.

Third Embodiment

Figure 4:
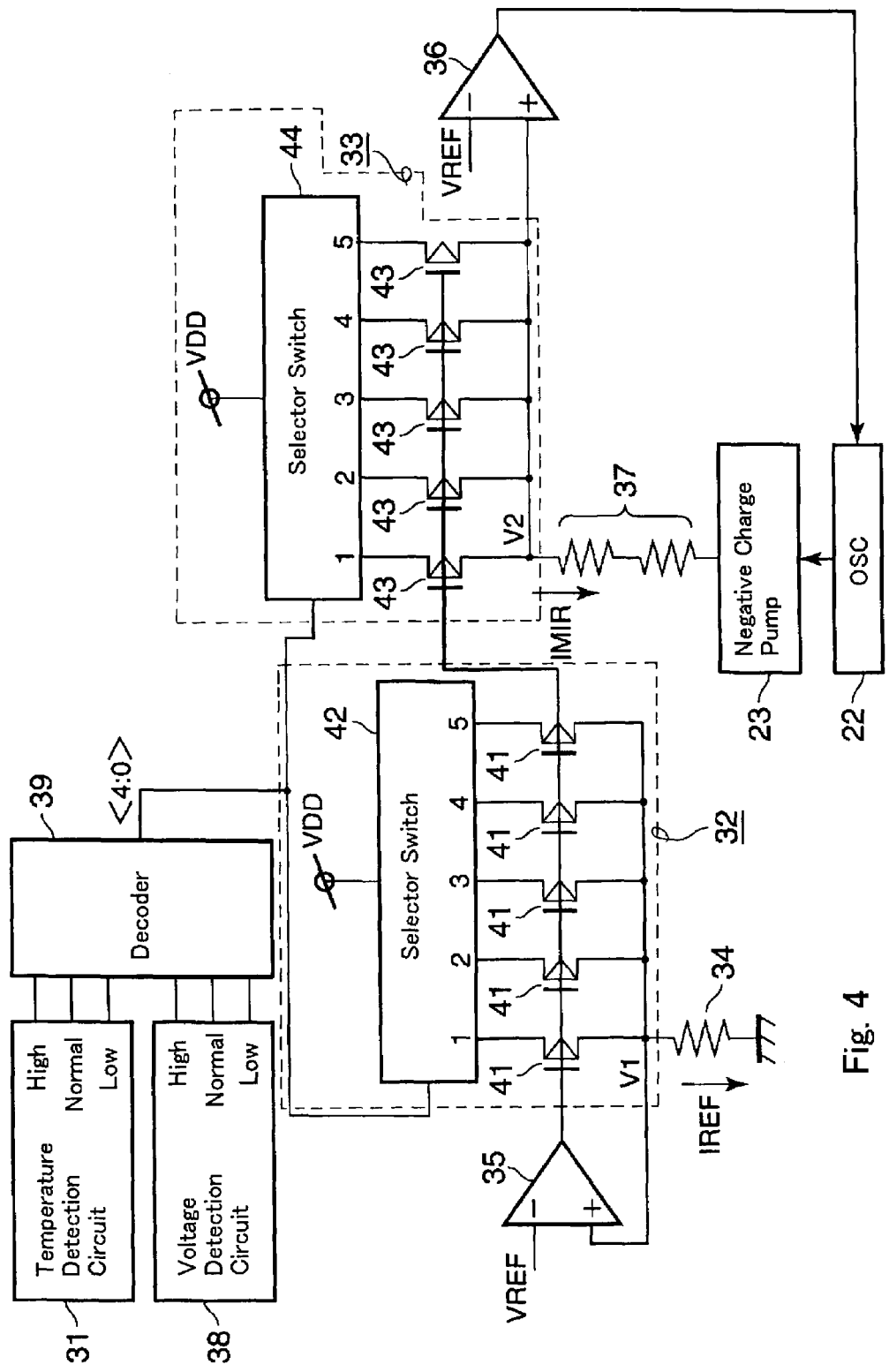
FIG. 4 is a circuit diagram of a negative voltage detection circuit according to a third embodiment.

FIG. 4 is a circuit diagram that shows the negative voltage detection circuit 21 according to a third embodiment.

In the negative voltage detection circuit 21 of the third embodiment, both the temperature detection circuit 31 and the voltage detection circuit 38 are provided. This configuration makes it possible to prevent a decrease in the detection precision of a negative voltage detector from being affected by fluctuations in both the temperature and/or the electric supply voltage.

In this embodiment, five P channel MOS transistors 41 are provided in the first MOS transistor circuit 32 and five P channel MOS transistors 43, are provided in the second MOS transistor circuit 33. In addition, the temperature detection circuit 31 is configured to output a control signal (see FIG. 5) to a decoder 39, and the voltage detection circuit 38 is configured to output a control signal (see FIG. 6) to the decoder 39. Upon receiving control signal(s) from one or both of the temperature detection circuit 31, and the voltage detection circuit 38, the decoder 39 controls the operation of the selector switch circuits 42 and 44. The other configurations are the same as those indicated in FIG. 2, and thus the same reference numerals are denoted to the parts corresponding to those in FIG. 2 and their descriptions will be omitted.

FIG. 7 shows the relationship between the detected temperature in the temperature detection circuit 31, the detected voltage in the voltage detection circuit 38, and the MOS transistors 41 of the first MOS transistor circuit 32 and the MOS transistors 43 of the second MOS transistor circuit 33. The MOS transistors are selected based on the control signal output by the decoder 39. As such, numerals "1" to "5" denote which of the transistors connected to the selector switch circuits 42 and 44 will be selected.

For example, when the detected temperature is low and the detected voltage is high, one of the five MOS transistors 41 in the first MOS transistor circuit 32 and one of the five MOS transistors 43, in the second MOS transistor circuit 33 are selected and a current flows therein. As such, the negative voltage detection circuit of this embodiment can simultaneously compensate for high voltage and low temperature while maintaining the current Ids. Alternately, when the detected temperature is high and the detected voltage is low, each of the five MOS transistors 41 in the first MOS transistor circuit 32 and each of the five MOS transistors 43, in the second MOS transistor circuit 33 are selected and a current flows therein. Thus, the drain current Ids can be maintained during any temperature and/or voltage fluctuation.

Additionally, as shown in FIG. 7, in the first and second MOS transistor circuits 32 and 33, the dimension size of a transistor is changed according to the detected temperature and the detected voltage, so that an optimal drain current Ids can be maintained.

As described above, in the negative voltage detection circuit of the third embodiment, even if the temperature and the power supply voltage change, the operating points of the transistors 41 and 43 constituting the current mirror circuit can always be optimally maintained. Therefore, even in the case where variation between a pair of MOS transistors is generated, a gap of a current between a reference current and a mirror current can be reduced, and thereby the fluctuation of the detection level of a negative voltage can be avoided.

Incidentally, the temperature detection circuit 31 shown in FIGS. 2 and 4 can be achieved by, for example, a circuit obtained by a combination of a BGR circuit and a diode. In addition, a circuit configuration as described in FIG. 8 may also be used as the voltage detection circuit 38 of FIGS. 3 and 4.

Figure 8:
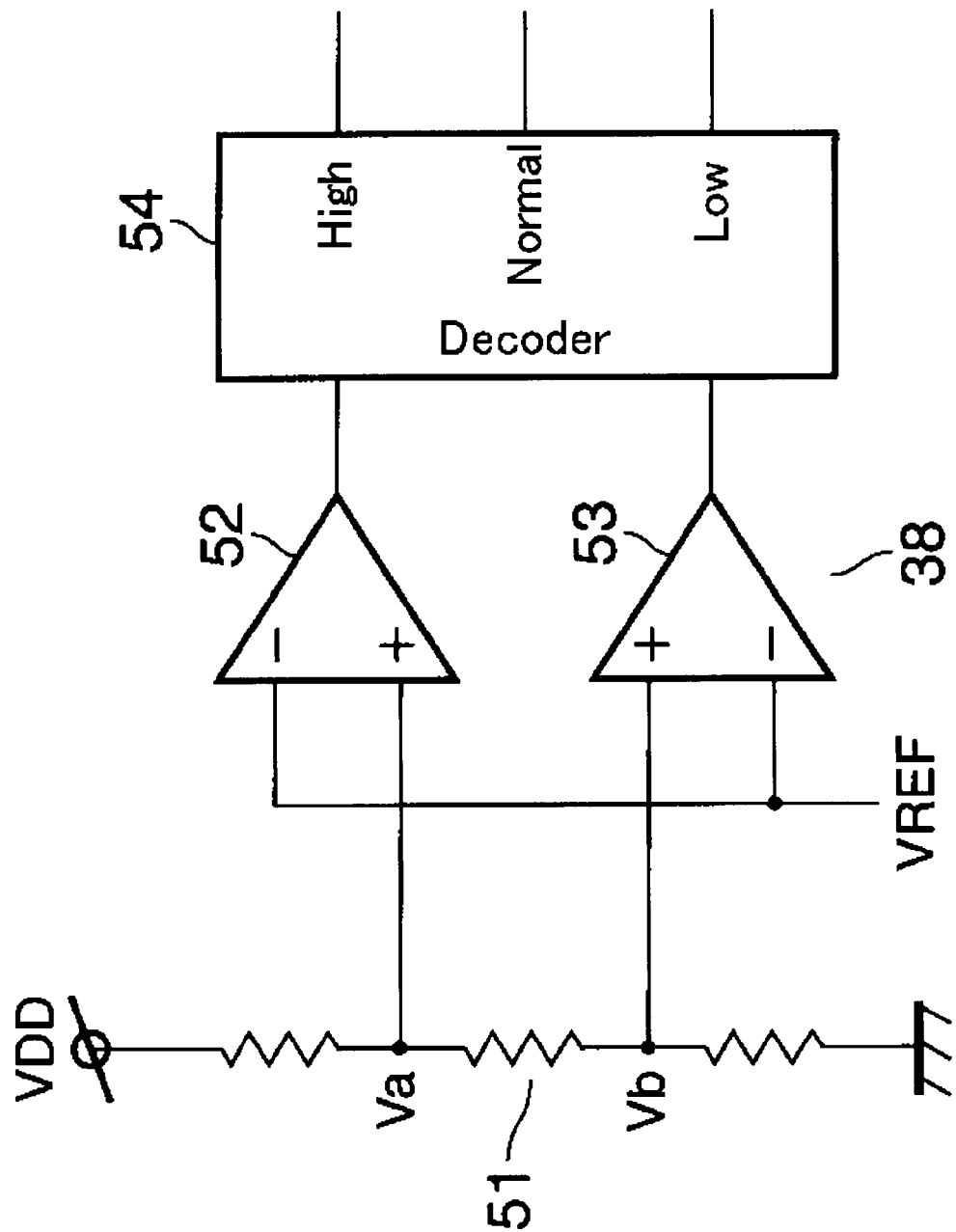
FIG. 8 is a block circuit diagram indicating a specific configuration example of a voltage detection circuit shown in FIGS. 3 and 4.

The voltage detection circuit 38 of FIG. 8 is coupled between the supply node of the power supply voltage VDD and the supply node of the ground voltage GND. The voltage detection circuit 38 comprises: a resistive divider 51 that generates divided voltages Va and Vb (Va>Vb) which are intermediates of VDD and GND; a comparator circuit 52 that compares a voltage Va generated in the resistive divider 51 with a reference voltage VREF; a comparator circuit 53 that compares a voltage Vb generated in the resistive divider 51 with the reference voltage VREF; and a decoder 54 that decodes the output of both the comparator circuits 52 and 53 and outputs a control signal. The control signal may be one of a high voltage, a medium voltage or a low voltage.

In the voltage detection circuit 38 of FIG. 8, the dividing ratio of the resistive divider 51 is set such that a control signal corresponding to a normal (medium) voltage is outputted from the decoder 54 when the value of the power supply voltage VDD is a medium voltage (specified value). Specifically, when the value of the power supply voltage VDD is a medium voltage (specified value), Va>V REF and VREF>Vb. As such, the output of the comparator circuit 53 is "H", the output of the comparator circuit 52 is "L". These signals are then input into the decoder 54 which generates a control signal corresponding to a medium voltage.

When the value of the power supply voltage VDD rises and Va>VREF and Vb>VREF, both the outputs from the comparator circuits 52 and 53 become "H". These signals are then input into the decoder 54 which generates a control signal corresponding to a high voltage. Finally, when the value of the power supply voltage VDD lowers and Va<VREF and Vb<VREF, both the outputs from the comparator circuits 52 and 53 become "L". These signals are then input into the decoder 54 which generates a control signal corresponding to a low voltage.

Numerous additional modifications and variations of the present invention are possible in light of the above-teachings. It is therefore to be understood that within the scope of the claims, the present invention can be practiced otherwise than as specifically described herein.

While the invention is subject to various modifications and alternative forms, specific embodiments thereof are shown by way of embodiments in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

What is claimed is:

1. A semiconductor integrated circuit comprising:
    a reference voltage generating circuit configured to generate a reference voltage;
    a positive voltage generating circuit configured to generate a positive polarity voltage on the basis of the reference voltage generated in the reference voltage generating circuit;
    a negative voltage generation circuit configured to generate a negative polarity voltage on the basis of the reference voltage generated in the reference voltage generating circuit, said negative voltage generation circuit further includes an oscillation circuit and a negative voltage boost circuit, wherein said negative voltage boost circuit is supplied with an oscillation output of the oscillation circuit, to generate the negative polarity voltage;
    a voltage switching circuit supplied with the positive polarity voltage generated in the positive voltage generating circuit and the negative polarity voltage generated in the negative voltage generating circuit, and configured to select and output either of the negative polarity voltage or the positive polarity voltage;
    a memory cell array configured to receive either the positive polarity voltage or the negative polarity voltage selected by the voltage switching circuit;
    a row decoder configured to receive either the positive polarity voltage or the negative polarity voltage selected by the voltage switching circuit; and
    a column decoder/sense amplifier configured to receive either the positive polarity voltage or the negative polarity voltage selected by the voltage switching circuit; and
    a negative voltage detection circuit configured to detect the negative polarity voltage generated in the negative voltage boost circuit to control the oscillation operation of the oscillation circuit, said negative voltage detection circuit including a detection circuit configured to detect at least one of a temperature or a power supply voltage, generate a control signal corresponding to the detection result, and output said control signal;

a first MOS transistor circuit in which a first end of a current path is coupled to a supply node of a power supply voltage, said first MOS transistor circuit being configured to change a dimension size of a transistor on the basis of the control signal;

a resistance including a first resistive end and a second resistive end, said first resistive end being coupled to a second end of the current path of the first MOS transistor circuit, and said second resistive end being coupled to a supply node of a ground potential;

a first comparator circuit configured to compare a first voltage generated at the first resistive end of the resistance with a reference voltage, and to control a gate electrode of the first MOS transistor circuit;

a second MOS transistor circuit in which a first end of a current path is coupled to a supply node of a power supply voltage, said second MOS transistor circuit being configured to change a dimension size of a transistor on the basis of the control signal, said second MOS transistor circuit further including a gate electrode commonly coupled to a gate electrode of the first MOS transistor circuit so as to form a current mirror circuit together with the first MOS transistor circuit;

a resistive divider including a first resistive end and a second resistive end, said first resistive end being configured to receive a negative voltage to be detected, and said second resistive end being coupled to a second end of the current path of the second MOS transistor circuit to generate a second voltage; and a second voltage comparator circuit configured to compare the second voltage with a reference voltage to generate a detection signal corresponding to the value of the negative voltage.

2. The semiconductor integrated circuit of claim 1, wherein each of said first and second MOS transistor circuits include:
   a plurality of MOS transistors with gate electrodes commonly coupled to each other, and
   a selector switch circuit coupled between the supply node of the power supply voltage and a first end of a source-drain current path of each of the plurality of MOS transistors, said selector switch circuit being configured to select a first end of the source-drain current path of at least one of the plurality of MOS transistors based on the control signal, and connect said first end to the supply node of the power supply voltage.

3. The semiconductor integrated circuit of claim 2, further comprising:
   a temperature detection circuit;
   a power supply voltage detection circuit; and
   a decoder circuit configured to decode a signal that is output from at least one of the temperature detection circuit and the power supply voltage detection circuit, said decoder circuit further configured to generate a control signal and supply said control signal to the selector switch circuit.

4. The semiconductor integrated circuit of claim 2, wherein a size of the plurality of MOS transistors are equal to each other.

5. The semiconductor integrated circuit of claim 2, wherein the detection circuit is further configured to detect a current temperature as being one of a first temperature range, a second temperature range or a third temperature range, and to generate and supply a control signal to the selector switch circuit, and
   the second temperature range is greater than the first temperature range, and the third temperature range is greater than the second temperature range.

6. The negative voltage detection circuit of claim 5, wherein each of said first and second MOS transistor circuits includes three MOS transistors with gate electrodes commonly coupled to each other, and
   the detection circuit is further configured to
      select one of the three MOS transistors in each of the first and second MOS transistor circuits when the temperature is in the first temperature range,
      select two of the three MOS transistors in each of the first and second MOS transistor circuits when the temperature is in the second temperature range, and
      select each of the three MOS transistors in each of the first and second MOS transistor circuits when the temperature is in the third temperature range.

7. The negative voltage detection circuit of claim 2, wherein
   the detection circuit is further configured to detect that a current voltage is in one of a first voltage range, a second voltage range, or a third voltage range, and to generate and supply a control signal to the selector switch, and
   the second voltage range is greater than the first voltage range, and the third voltage range is greater than the second voltage range.

8. The negative voltage detection circuit of claim 7, wherein each of said first and second MOS transistor circuits includes three MOS transistors with gate electrodes commonly coupled to each other, and
   the detection circuit is further configured to
      select one of the three MOS transistors in each of the first and second MOS transistor circuits when the voltage is in the third voltage range,
      select two of the three MOS transistors in each of the first and second MOS transistor circuits when the voltage is in the second voltage range, and
      select each of the three MOS transistors in each of the first and second MOS transistor circuits when the voltage is in the first voltage range.

9. The negative voltage detection circuit of claim 3, wherein the temperature detection circuit is further configured to detect a current temperature as being one of a first temperature range, a second temperature range or a third temperature range, and to generate and supply a control signal to the decoder circuit,
   the second temperature range is greater than the first temperature range, and the third temperature range is greater than the second temperature range,
   the power supply voltage detection circuit is configured to detect that a current voltage is in one of a first voltage range, a second voltage range, or a third voltage range, and to generate and supply a control signal to the decoder circuit, and
   the second voltage range is greater than the first voltage range, and the third voltage range is greater than the second voltage range.

10. The negative voltage detection circuit of claim 9, wherein each of said first and second MOS transistor circuits further include five MOS transistors with gate electrodes commonly coupled to each other, and
    the detection circuit is further configured to
       select one of the five MOS transistors in each of the first and second MOS transistor circuits when the voltage is in the third voltage range and the temperature is in the first temperature range, select two of the five MOS transistors in each of the first and second MOS transistor circuits when the voltage is in the third voltage range and the temperature is in the second temperature range, or when the voltage is in the second voltage range and the temperature is in the first temperature range, select three of the five MOS transistors in each of the first and second MOS transistor circuits when the voltage is in the first voltage range and the temperature is in the first temperature range, or when the voltage is in the second voltage range and the temperature is in the second temperature range, or when the voltage is in the third voltage range and the temperature is in the third temperature range, select four of the five MOS transistors in each of the first and second MOS transistor circuits when the voltage is in the second voltage range and the temperature is in the third temperature range, or when the voltage is in the first voltage range and the temperature is in the second temperature range, or when the voltage is in the third voltage range and the temperature is in the third temperature range, and select each of the five MOS transistors in each of the first and second MOS transistor circuits when the voltage is in the first voltage range and the temperature is in the third temperature range.

* * * * *